United States Patent
Shih

(10) Patent No.: US 10,553,433 B2
(45) Date of Patent: Feb. 4, 2020

(54) METHOD FOR PREPARING A SEMICONDUCTOR STRUCTURE

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/190,876

(22) Filed: Nov. 14, 2018

(65) Prior Publication Data

US 2019/0139767 A1 May 9, 2019

Related U.S. Application Data

(62) Division of application No. 15/808,359, filed on Nov. 9, 2017.

(51) Int. Cl.
*H01L 21/033* (2006.01)
*H01L 27/105* (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 27/105* (2013.01)

(58) Field of Classification Search
CPC ............. H01L 21/0332; H01L 21/0335; H01L 21/0337; H01L 21/0338; H01L 21/7681; H01L 21/76811; H01L 21/76813; H01L 21/31144; H01L 21/32139; H01L 27/105; H01L 27/10894

See application file for complete search history.

(56) References Cited

U.S. PATENT DOCUMENTS

| 2011/0124198 A1* | 5/2011 | Lee | H01L 21/0337 438/735 |
| 2015/0056810 A1 | 2/2015 | Nair et al. | |
| 2016/0233297 A1* | 8/2016 | Tomoyama | H01L 27/10897 |
| 2017/0025284 A1* | 1/2017 | Kang | H01L 27/0207 |

FOREIGN PATENT DOCUMENTS

| TW | 201101368 A | 1/2011 |
| TW | 201735168 A | 10/2017 |

OTHER PUBLICATIONS

An Office action from the corresponding Taiwanese application, dated Oct. 18, 2018, 6 pages.
Office Action dated Sep. 6, 2019 in related U.S. Appl. No. 15/808,359, 8 pages.

* cited by examiner

*Primary Examiner* — Joseph M Galvin, III
(74) *Attorney, Agent, or Firm* — Muncy, Geissler, Olds & Lowe, P.C.

(57) ABSTRACT

A method for preparing a semiconductor structure includes the following steps: providing a substrate including a first region and a second region defined thereon, forming a first mask structure over the substrate, forming a plurality of first features in the first mask structure in the first region, forming a second mask structure over the first mask structure, simultaneously forming a plurality of second features in the second mask structure in the second region and a plurality of third features in the second mask structure in the first region, and transferring the second features and the third features to the first mask structure to simultaneously form a plurality of islanding features in the first region and a plurality of line features in the second region.

12 Claims, 16 Drawing Sheets

METHOD FOR PREPARING A SEMICONDUCTOR STRUCTURE

PRIORITY CLAIM AND CROSS-REFERENCE

This application is a divisional application of U.S. patent application Ser. No. 15/808,359, filed on Nov. 9, 2017. The entirety of the above-mentioned patent application is hereby incorporated by reference herein and made a part of this specification.

TECHNICAL FIELD

The present disclosure relates to a method for preparing a semiconductor structure, and more particularly, to a semiconductor structure including patterns of different shapes and a patterning method for preparing the semiconductor structure.

DISCUSSION OF THE BACKGROUND

In semiconductor manufacturing processes, photolithography techniques are commonly adopted to define structures. Typically, an integrated circuit layout is designed and outputted onto one or more photomasks. The integrated circuit layout is then transferred from the photomask(s) to a mask layer to form a mask pattern, and then from the mask pattern to a target layer. However, with the advancing miniaturization and integration requirements of semiconductor devices, including memory devices such as dynamic random access memories (DRAMs), flash memories, static random access memories (SRAMs), and ferroelectric (FE) memories, the semiconductor structures or features for such devices become finer and more miniaturized as well. Accordingly, the continual reduction in semiconductor structure and feature sizes places ever-greater demands on the techniques used to form the structures and features.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a method for preparing a semiconductor structure. The method includes the following steps: A substrate including a first region and a second region defined thereon is provided. A first mask structure is formed over the substrate. A plurality of first features extending in a first direction is formed in the first mask structure in the first region. A second mask structure is formed over the first mask structure. A plurality of second features is formed in the second mask structure in the second region and a plurality of third features is formed in the second mask structure in the first region, simultaneously. The second features extend in the first direction and the third features extend in a second direction different from the first direction. The second features and the third features are transferred to the first mask structure to simultaneously form a plurality of islanding features in the first region and a plurality of line features in the second region.

In some embodiments, the step of forming the first features further includes the following steps: A plurality of first patterns is formed over the first mask structure. A plurality of spacers is formed over sidewalls of each first pattern. A plurality of second patterns is formed over the first mask structure. The spacers are removed to form a plurality of openings between the first patterns and the second patterns. Next, the first mask structure is etched through the openings to form the first features.

In some embodiments, the second mask structure fills spaces between the first features to form an even surface.

In some embodiments, the step of forming the second features and the third features further includes the following steps: A plurality of third patterns is formed in the first region and a plurality of fourth patterns is formed in the second region over the second mask structure. Next, a plurality of fifth patterns is formed in the first region and a plurality of sixth patterns is formed in the second region over the second mask structure, wherein the third patterns and the fifth patterns are alternately arranged, and the fourth patterns and the sixth patterns are alternately arranged. Next, the third patterns, the fourth patterns, the fifth patterns, and the sixth patterns are transferred to the second mask structure to form the second features and the third features.

In some embodiments, the third patterns and the fifth patterns extend in the second direction, and the fourth patterns and the sixth patterns extend in the first direction.

In some embodiments, distances between adjacent third and fifth patterns are the same.

In some embodiments, distances between adjacent fourth and sixth patterns are the same.

In some embodiments, the method for preparing the semiconductor structure further includes a step of forming a frame feature between the first region and the second region.

In some embodiments, the third features are in contact with the frame pattern.

In some embodiments, at least a portion of the frame feature is adjacent to one of the second features.

In some embodiments, the method further includes transferring the islanding features and the line features from the first mask structure to the substrate to form a plurality of islanding structures in the first region and a plurality of line structures in the second region.

In some embodiments, the first direction and the second direction form an included angle, and the included angle is equal to or less than 90°.

Another aspect of the present disclosure provides a semiconductor structure. The semiconductor structure includes a substrate including a first region and a second region defined thereon, a plurality of islanding structures disposed in the first region, a plurality of line structures disposed in the second region, and a frame structure disposed between the first region and the second region. The islanding structures are arranged in a first direction and a second direction to form an array. The first direction and the second direction are different from each other. The line structures extend in the first direction. The frame structure is adjacent to one of the line structures, and a distance between the frame structure and its adjacent line structure is greater than a distance between two adjacent line structures.

In some embodiments, the islanding structures, the line structures and the frame structure include a same material.

In some embodiments, distances between pairs of islanding structures in the first direction are the same. In some embodiments, distances between pairs of islanding structures in the second direction are the same.

In some embodiments, the frame structure surrounds the array formed by the islanding structures.

In some embodiments, a width of the frame structure is greater than a width of the line structures. In some embodiments, the width of the frame structure is greater than a width of the islanding structures.

In the present disclosure, the semiconductor structure further includes at least a dummy structure disposed between one of the islanding structures and the frame structure.

In some embodiments, the dummy structure is in contact with the frame structure.

In some embodiments, the first direction and the second direction form an included angle, and the included angle is equal to or less than 90°.

In the present disclosure, a method for forming a semiconductor structure is provided. The method includes forming the first features in the first region by a pitch doubling process, and forming the second features in the second region and the third features in the first region by double patterning. By integrating the two processes, sophisticated and fine islanding features can be formed in the first region while slim line features can be formed in the second region simultaneously. Accordingly, process duration is reduced.

In contrast, with a comparative method, the islanding structures in the first region are formed before or after the formation of the line structures in the second region, and thus the comparative method suffers from certain disadvantages, such as long process duration and limited process throughput.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

FIGS. 4B, 5B, 6B, 7B, 8B, 9B, 10B, 11B, 12B, 13B, 14B, 15B to 16B are cross-sectional views take in line A-A' of FIGS. 4A, 5A, 6A, 7A, 8A, 9A, 10A, 11A, 12A, 13A, 14A, 15A, and 16A, respectively.

DETAILED DESCRIPTION

Figure 1:
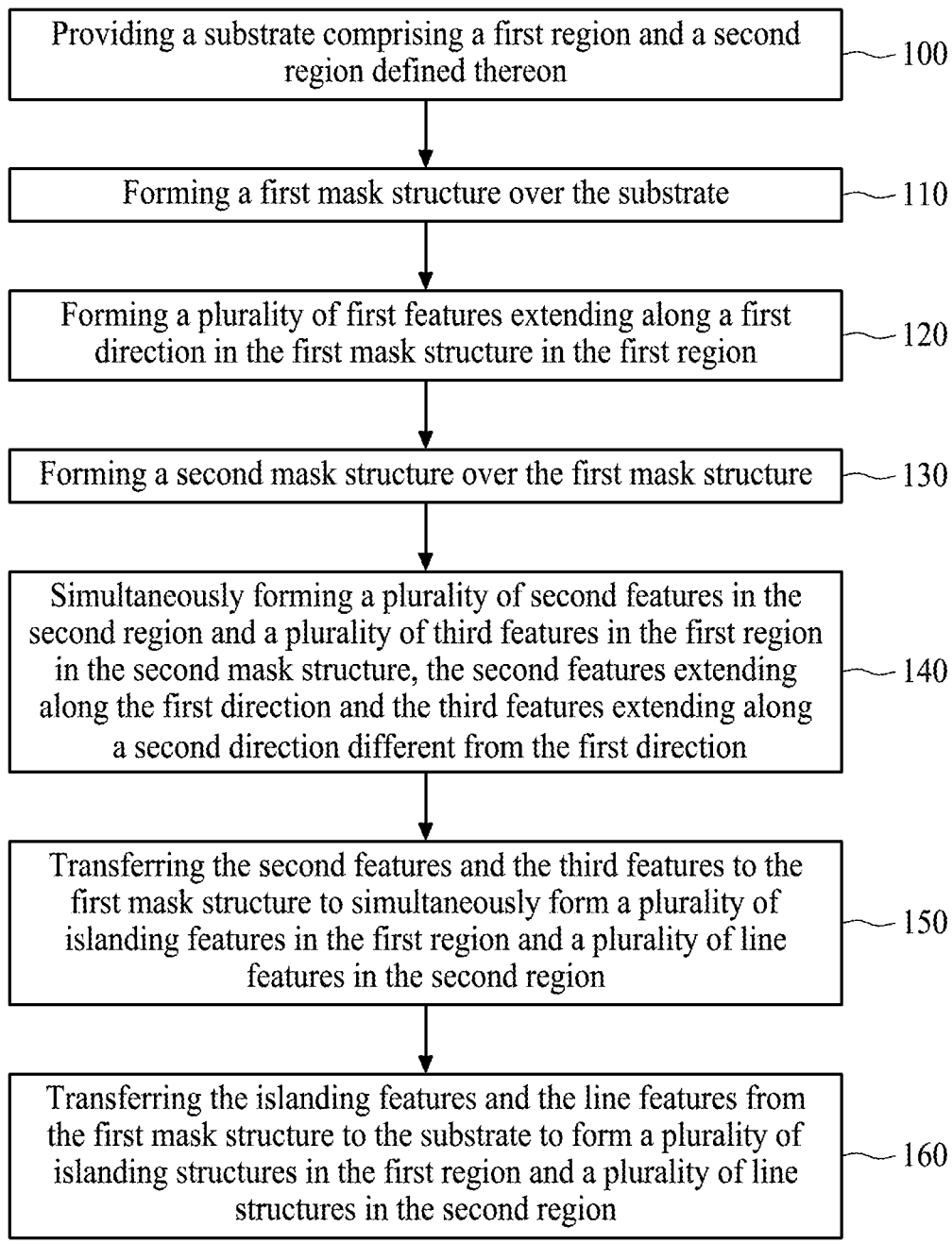
FIG. 1 is a flow diagram illustrating a method for preparing a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the term "feature" refers to parts of a pattern, such as lines, spaces, via, pillars, trenches, troughs, or moats. As used herein, the term "core" refers a mask feature formed at a vertical level. As used herein, "target layer" refers to a layer in which a pattern of semiconductor structures is to be formed. A target layer may be part of the substrate. A target layer may be a metal layer, a semiconductor layer, or an insulating layer formed over the substrate.

As used herein, the terms "patterning" or "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist, or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

FIG. 1 is a flow diagram illustrating a method for preparing a semiconductor structure 10 in accordance with some embodiments of the present disclosure. The method for preparing semiconductor structure 10 includes a step 100, providing a substrate including a first region and a second region defined thereon. The method for preparing the semiconductor structure 10 further includes a step 110, forming a first mask structure over the substrate. The method for preparing the semiconductor structure 10 further includes a step 120, forming a plurality of first features extending in a first direction in the first mask structure in the first region. The method for preparing the semiconductor structure 10 further includes a step 130, forming a second mask structure over the first mask structure. The method for preparing the semiconductor structure 10 further includes a step 140, simultaneously forming a plurality of second features in the second region and a plurality of third features in the first region in the second mask structure. Further, the second features extend in the first direction and the third features extend in a second direction different from the first direction. The method for preparing the semiconductor structure 10 further includes a step 150, transferring the second features and the third features to the first mask structure to form a plurality of islanding features in the first region and a plurality of line features in the second region. The method for preparing the semiconductor structure 10 further includes a step 160, transferring the islanding features and the line features from the first mask structure to the substrate to form a plurality of islanding structures in the first region and a plurality of line structures in the second region. The method for preparing the semiconductor structure 10 will be further described according to one or more embodiments.

Figure 2:
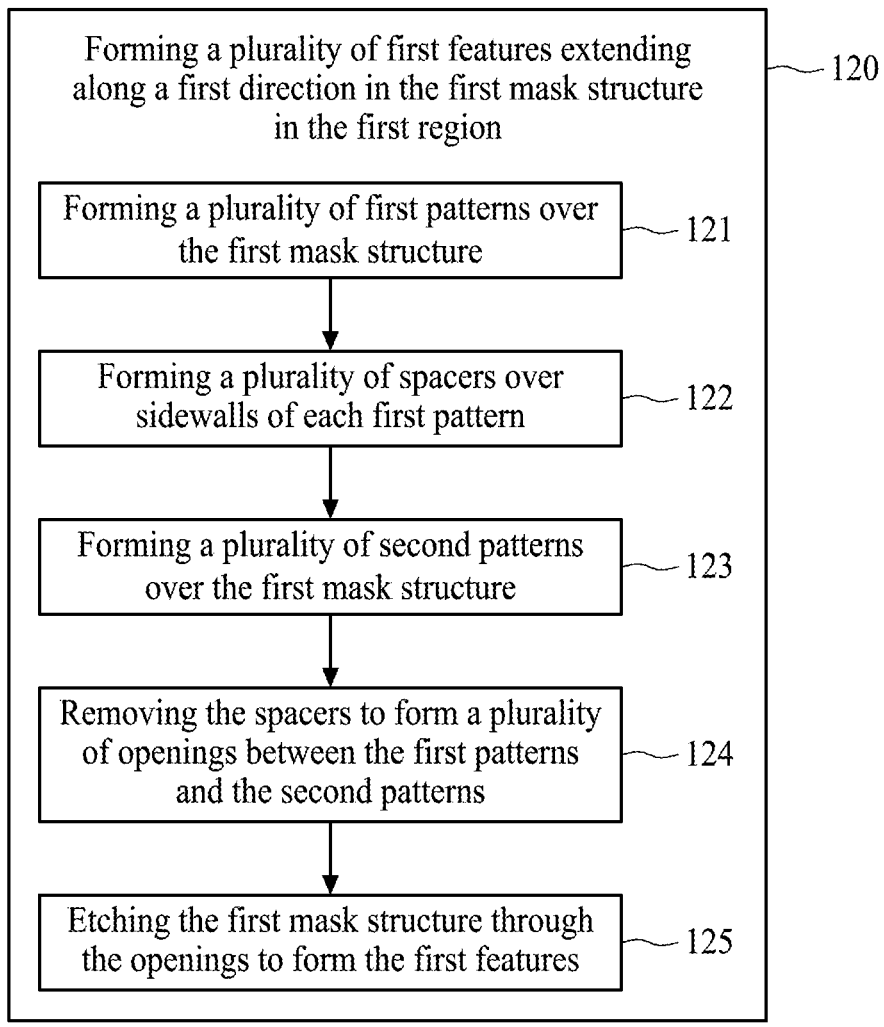
FIG. 2 is a flow diagram illustrating a step of the method for preparing the semiconductor structure in accordance with some embodiments of the present disclosure.

FIG. 2 is a flow diagram illustrating further details of the step 120 of the method for preparing the semiconductor structure 10 in accordance with some embodiments of the present disclosure. The step 120 of the method for preparing the semiconductor structure 10 further includes a step 121, forming a plurality of first patterns over the first mask structure. The step 120 of the method for preparing the semiconductor structure 10 further includes a step 122, forming a plurality of spacers over sidewalls of each first pattern. The step 120 of the method for preparing the semiconductor structure 10 further includes a step 123, forming a plurality of second patterns over the first mask structure. The step 120 of the method for preparing the semiconductor structure 10 further includes a step 124, removing the spacers to form a plurality of openings between the first patterns and the second patterns. The step 120 of the method for preparing the semiconductor structure 10 further includes a step 125, etching the first mask structure through the openings to form the first features.

Figure 3:
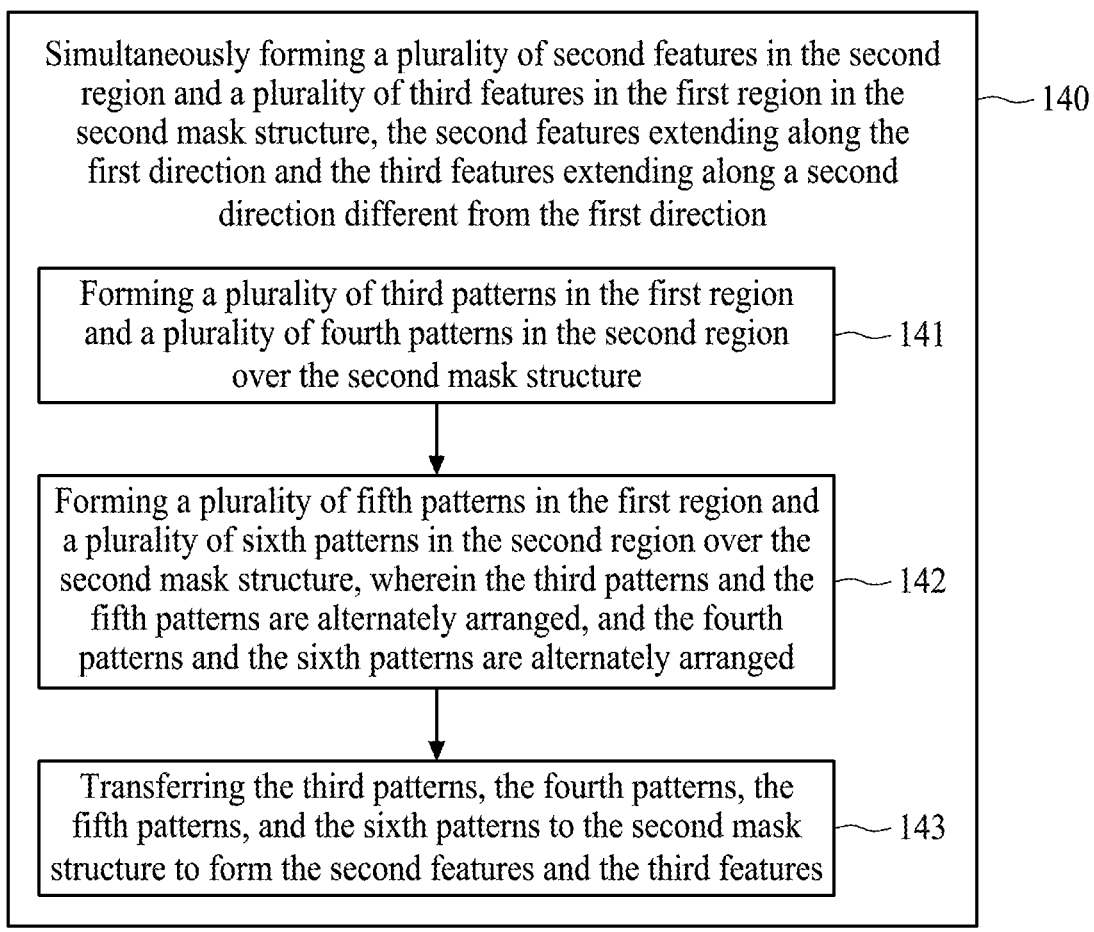
FIG. 3 is a flow diagram illustrating a step of the method for preparing the semiconductor structure in accordance with some embodiments of the present disclosure.

FIG. 3 is a flow diagram illustrating further details of the step 140 of the method for preparing the semiconductor structure 10 in accordance with some embodiments of the present disclosure. The step 140 of the method for preparing the semiconductor structure 10 further includes a step 141, forming a plurality of third patterns in the first region and a plurality of fourth patterns in the second region over the second mask structure. The step 140 of the method for preparing the semiconductor structure 10 further includes a step 142, forming a plurality of fifth patterns in the first region and a plurality of sixth patterns in the second region over the second mask structure. The third patterns and the fifth patterns are alternately arranged, and the fourth patterns and the sixth patterns are alternately arranged. The step 140 of the method for preparing the semiconductor structure 10 further includes a step 143, transferring the third patterns, the fourth patterns, the fifth patterns and the sixth patterns to the second mask structure to form the second features and the third features.

Figure 4A:
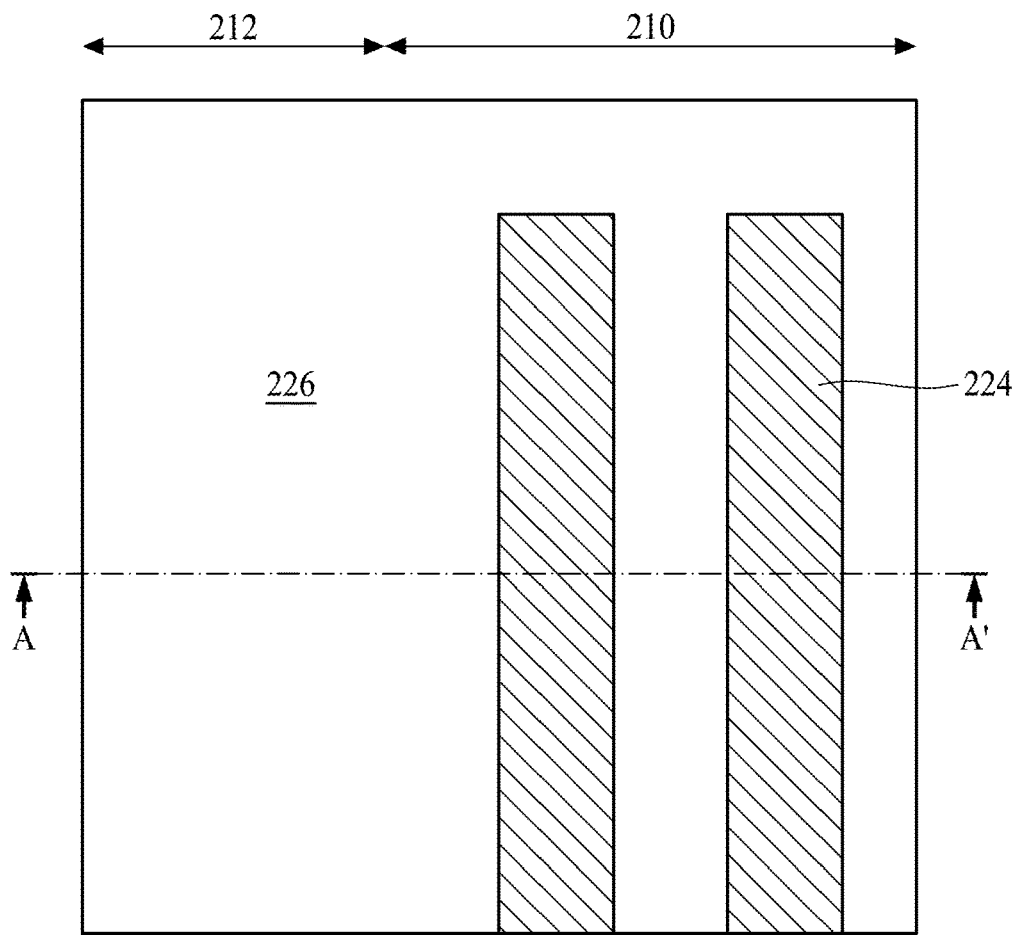
FIGS. 4A, 5A, 6A, 7A, 8A, 9A, 10A, 11A, 12A, 13A, 14A, 15A, and 16A are schematic diagrams illustrating various fabrication stages of the method for preparing the semiconductor structure in accordance with some embodiments of the present disclosure.
Figure 4B:
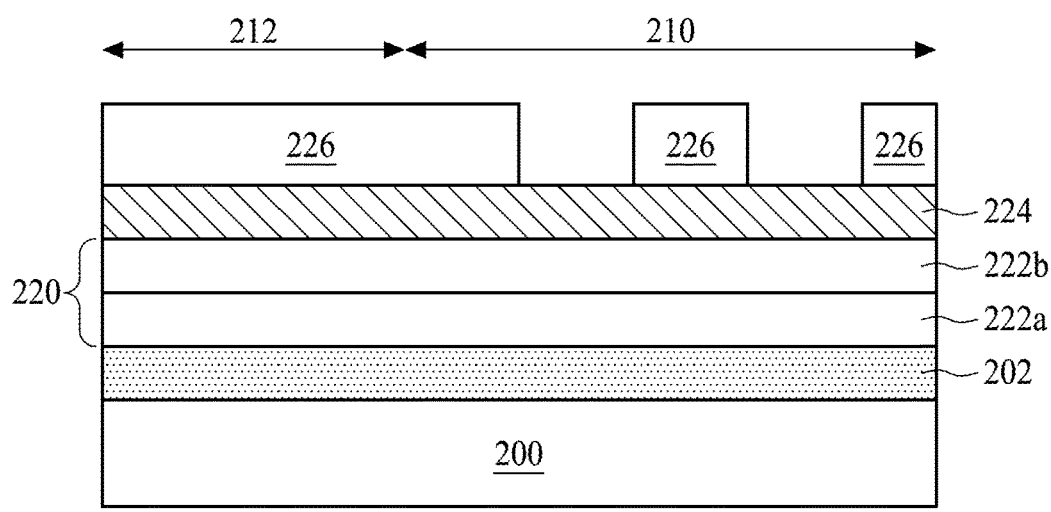

FIGS. 4A, 5A, 6A, 7A, 8A, 9A, 10A, 11A, 12A, 13A, 14A, 15A, and 16A are schematic diagrams illustrating various fabrication stages according to the method for preparing the semiconductor structure 10 in accordance with some embodiments of the present disclosure, FIGS. 4B, 5B, 6B, 7B, 8B, 9B, 10B, 11B, 12B, 13B, 14B, 15B, and 16B are cross-sectional views take in a line A-A' of FIGS. 4A, 5A, 6A, 7A, 8A, 9A, 10A, 11A, 12A, 13A, 14A, 15A, and 16A, respectively. Referring to FIGS. 4A and 4B, a substrate 200 including a first region 210 and a second region 212 defined thereon is provided according to step 100. In some embodiments of the present disclosure, the first region 210 is an array region and the second region 212 is a peripheral region. A plurality of semiconductor memory cells may be formed in the array region 210, and peripheral transistors constituting a peripheral circuit may be formed in the peripheral region 212. The substrate 200 can include silicon (Si), gallium (Ga), gallium arsenide (GaAs), gallium nitride (GaN), strained silicon, silicon-germanium (SiGe), silicon carbide (SiC), diamond, epitaxy layer or a combination thereof. In some embodiments of the present disclosure, a target layer 202 is formed over the substrate 200. The target layer 202 can include multiple layers or a single layer. The target layer 202 may be a layer in which various IC components, parts, or structures are to be formed through IC fabrication processes. Examples of the components, parts, or structures include transistors, capacitors, resistors, diodes, conductive lines, electrodes, spacers, trenches, etc. The target layer 202 can include materials that are selected based on the types of devices to be formed. Examples of the target layer materials include, for example but not limited to, dielectric materials, semiconductive materials, and conductive materials.

Referring to FIGS. 4A and 4B, a first mask structure 220 is formed over the target layer 202 and the substrate 200 according to step 110. In some embodiments of the present disclosure, the first mask structure 220 includes a multi-layered structure. For example, the first mask structure 220 can include at least one first mask layer 222a and one second mask layer 222b stacked on the first mask layer 222a. The first mask layer 222a and the second mask layer 222b can include different materials or materials sufficiently different in compositions that the second mask layer 222b can be selectively removable using an appropriate etch chemistry relative to the first mask layer 222a. By way of example and not limitation, the first mask layer 222a can include a silicon oxide (SiO) material, a silicon nitride (SiN) material, or a silicon oxynitride (SiON) material. The second mask layer 222b can include a SiO material, a SiN material, or a SiON material. The second mask layer 222b is selected such that the second mask layer 222b is selectively removed without affecting the first mask layer 222a when using an appropriate chemistry. One of ordinary skill in the art would easily understand that the present disclosure may include selecting a single hard mask or a bi-layered hard mask based on cost, time, performance, and processing considerations for a given application.

Still referring to FIGS. 4A and 4B, another mask layer or a sacrificial layer 224 is formed over the first mask structure 220. In some embodiments of the present disclosure, the sacrificial layer 224 can include organic materials, and the organic materials can include photosensitive material(s) or non-photosensitive material(s), but the disclosure is not limited thereto. Next, a patterned photoresist 226 is formed over the sacrificial layer 224. The patterned photoresist 226 can include lines formed by performing, for example but not limited to, conventional photolithography, as is known in the art of semiconductor manufacturing. It should be understood that although two lines of the patterned photoresist 226 are illustrated in FIGS. 4A and 4B for simplicity of explanation, any number of lines may be formed, as will be apparent to one of ordinary skill in the art upon consideration of the present disclosure. It should be noted that, according to the present embodiment, the lines are formed in the first region 210 while the second region 212 is entirely covered by the patterned photoresist 226.

Figure 5A:
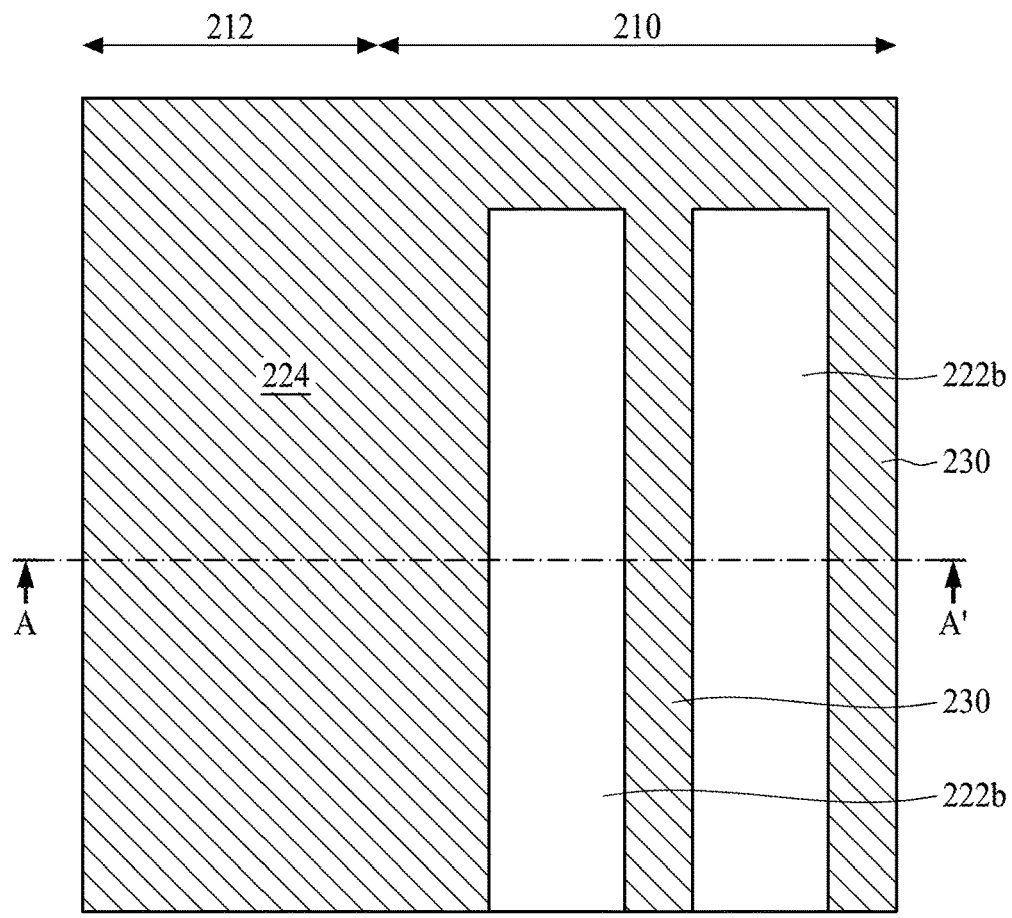
Figure 5B:
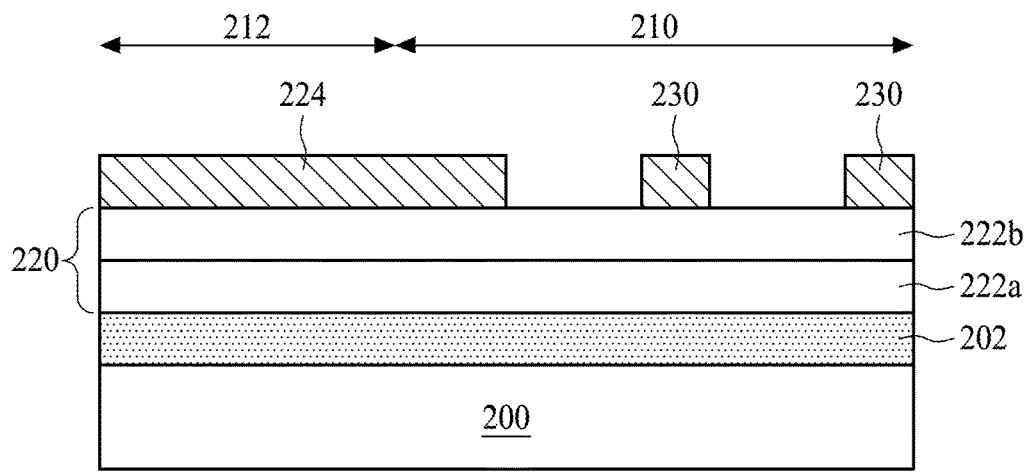

Referring to FIGS. 5A and 5B, the sacrificial layer 224 is etched through the patterned photoresist 226 to form a plurality of first patterns 230 over the first mask structure 220 in the first region 210 according to step 121. As shown in FIGS. 5A and 5B, the first patterns 230 are spaced apart from each other. It should be easily realized by those skilled in the art that the first patterns 230 including the lines as defined by the patterned photoresist 226 are all formed in the first region 210 while the sacrificial layer 224 in the second region 212 is protected by the patterned photoresist 226 during forming of the first patterns 230. Thereafter, the patterned photoresist 226 is removed. Additionally, a trimming step can be performed, and thus a width of each first pattern 230 may be less than a width of the lines of the patterned photoresist 226.

Figure 6A:
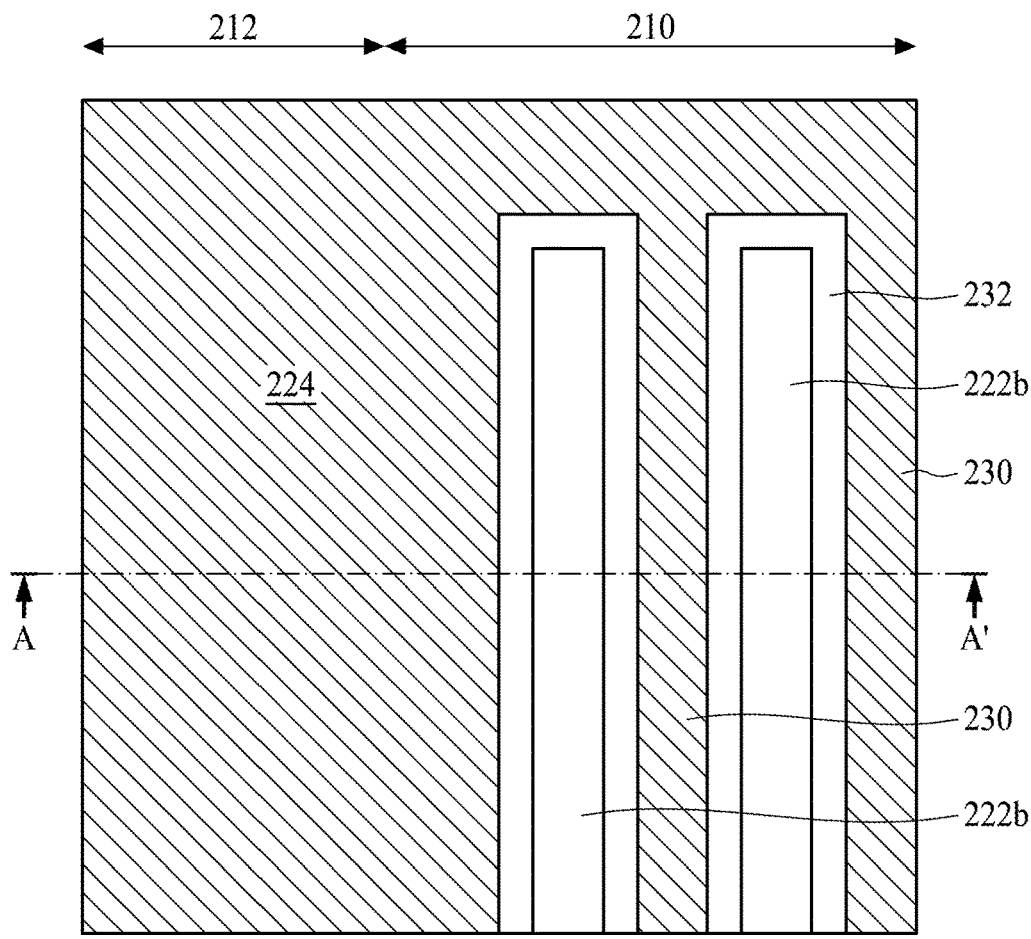
Figure 6B:
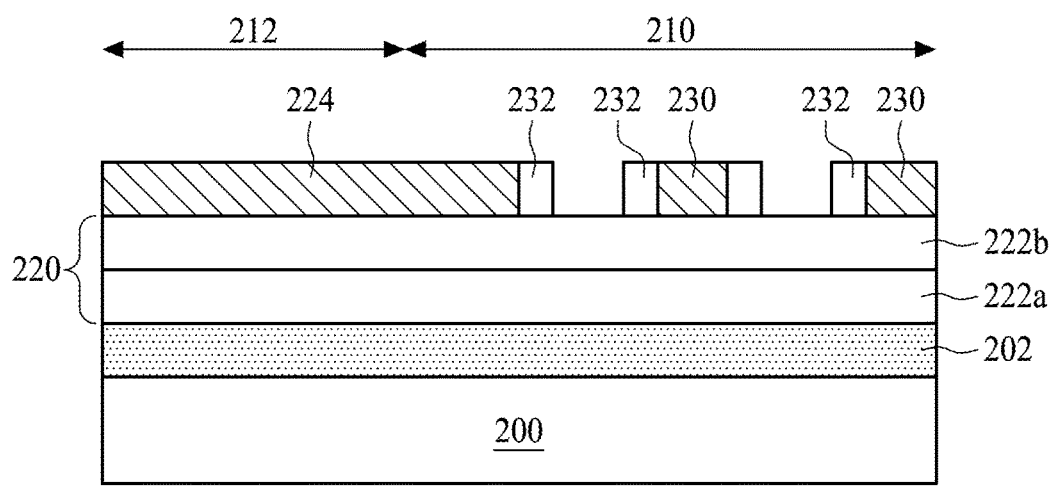

Referring to FIGS. 6A and 6B, a spacer layer (not shown) is formed over the first patterns 230. The spacer layer is conformally formed to cover or coat sidewalls and top surfaces of each first pattern 230. In some embodiments of the present disclosure, the spacer layer can include materials different from those of the sacrificial layer 224, but the disclosure is not limited thereto. In some embodiments of the present disclosure, the spacer layer can include, for example but not limited to, SiN, SiO, SiON, a combination thereof, a stack layer thereof, or the like. An etching back step is subsequently performed, and thus a plurality of spacers 232 covers sidewalls of each first pattern 230 according to step 122, as shown in FIGS. 6A and 6B.

Figure 7A:
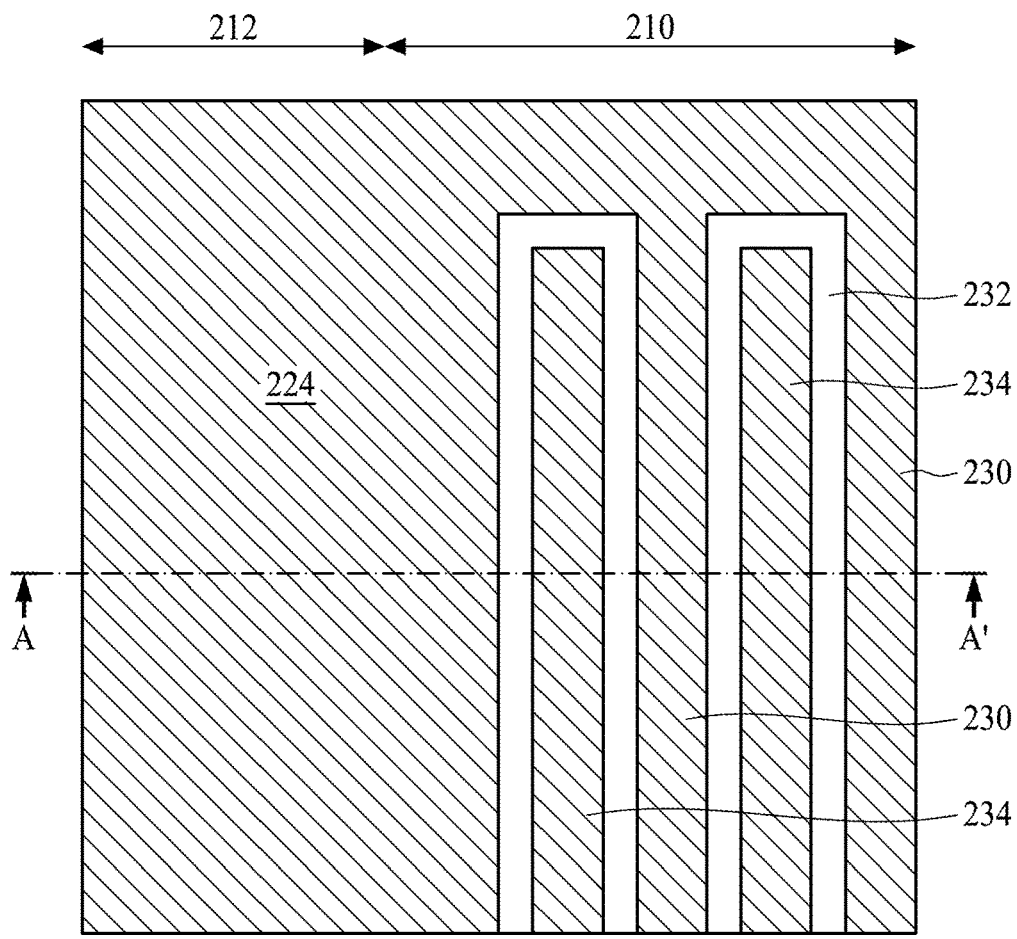
Figure 7B:
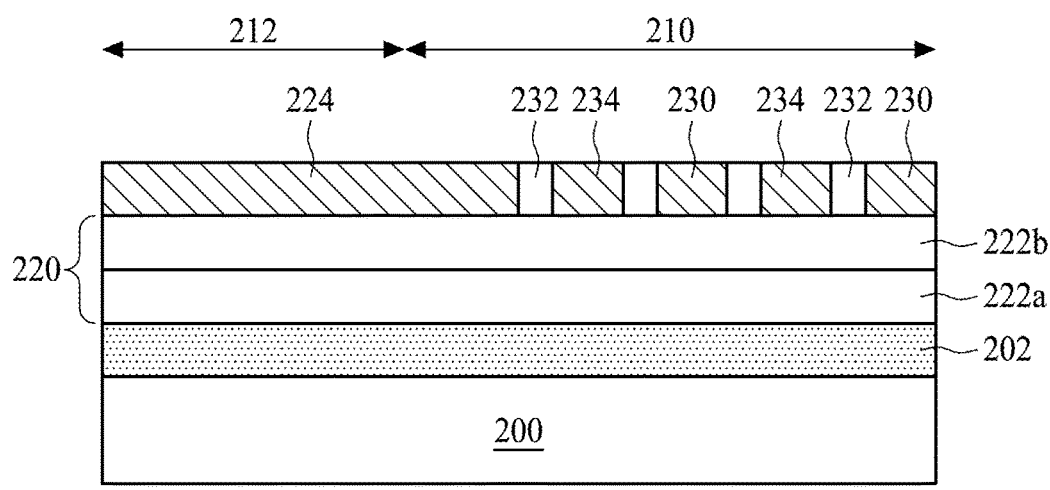

Referring to FIGS. 7A and 7B, another sacrificial layer (not shown) is formed over the substrate 200. The sacrificial layer is formed to fill the spaces between the first patterns 230 and the spacers 232. In some embodiments of the present disclosure, the sacrificial layer can include organic materials, and the organic materials can include photosensitive materials or non-photosensitive materials, but the disclosure is not limited thereto. In some embodiments of the present disclosure, the sacrificial layer includes materials different from those of the sacrificial layer 224. In some embodiments of the present disclosure, the sacrificial layer 224 and the sacrificial layer include the same material. Next, a portion of the sacrificial layer is removed to form a plurality of second patterns 234 over the first mask structure 220 according to step 123. Additionally, the spacers 232 and the first patterns 230 are exposed as shown in FIGS. 7A and 7B.

Figure 8A:
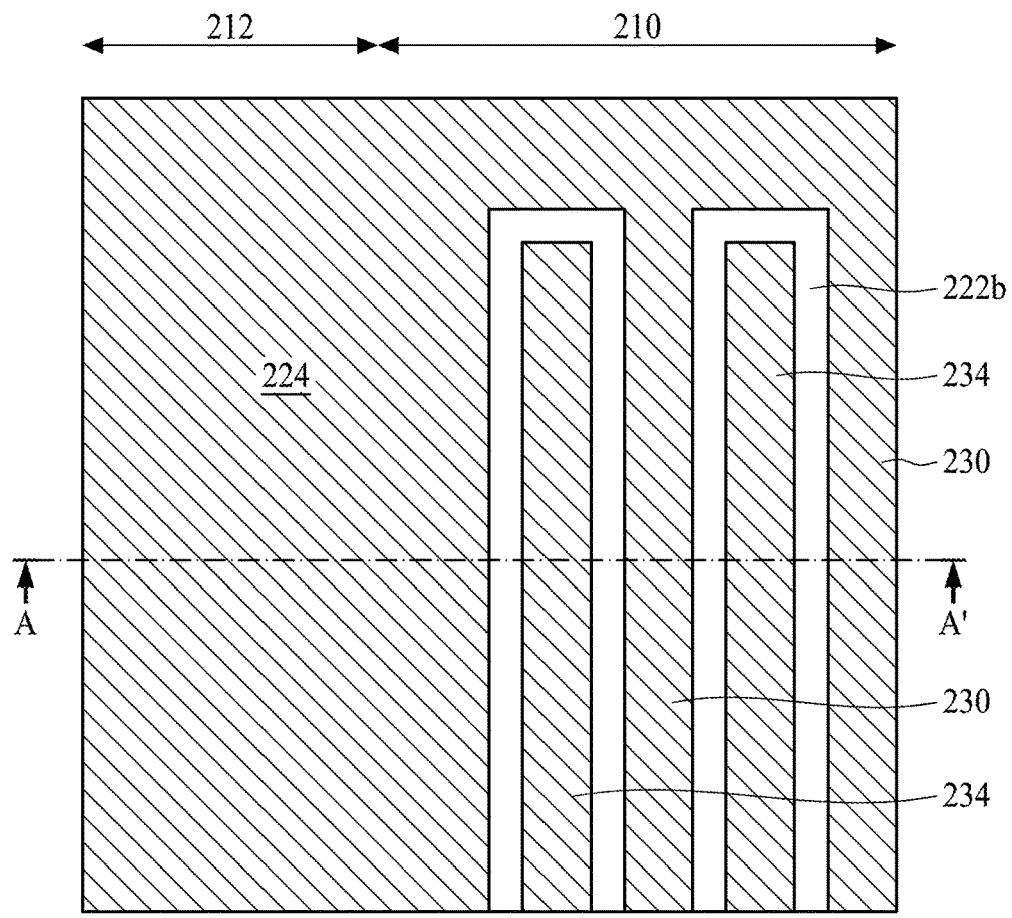
Figure 8B:
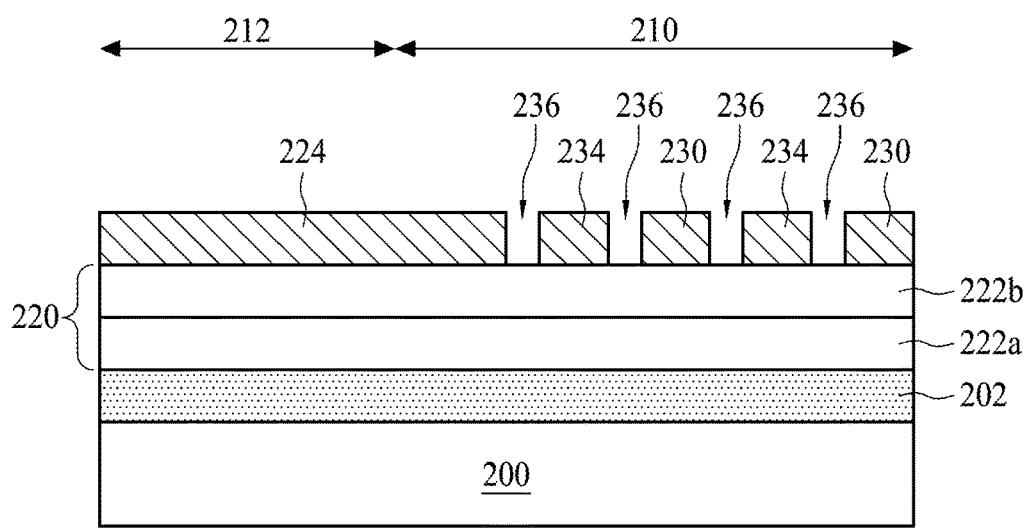

Referring to FIGS. 8A and 8B, the spacers 232 are removed to form a plurality of openings 236 between the first patterns 230 and the second patterns 234 according to step 124. In some embodiments of the present disclosure, the first mask structure 220, such as the second mask layer 222b, is exposed at bottoms of the openings 236 as shown in FIGS. 8A and 8B. Accordingly, the first patterns 230 and the second patterns 234 are alternately arranged, and spaced apart from each other by the openings 236.

Figure 9A:
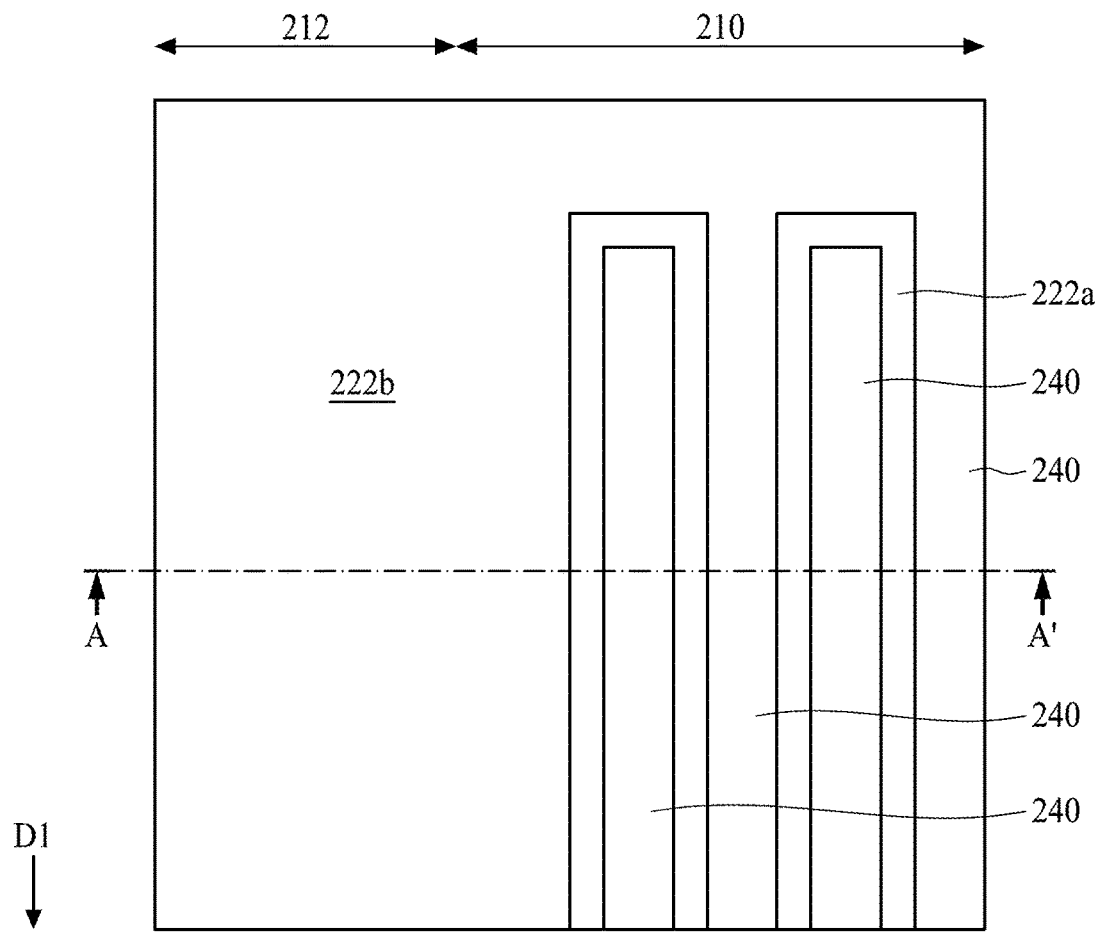
Figure 9B:
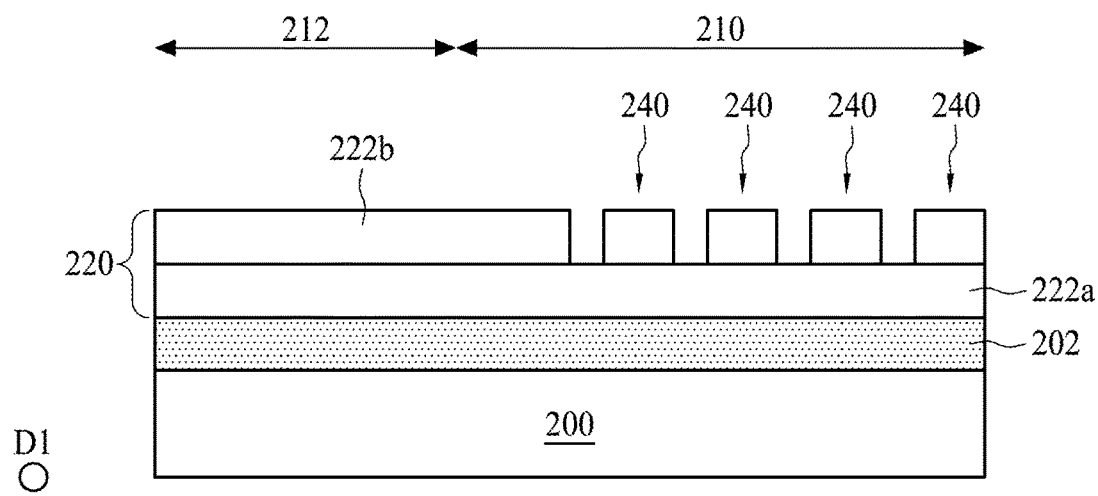

Referring to FIGS. 9A and 9B, next, at least a portion of the first mask structure 222b exposed at the bottoms of the openings 236 is etched through the openings 236 according to step 125. Accordingly, a plurality of first features 240 extending in a first direction D1 is formed in the first mask structure 220 in the first region 210 according to step 120, which includes the abovementioned steps 121 to 125. Additionally, the sacrificial layer 224 is then removed. In some embodiments, the first features 240 all include a same width and are spaced apart from each other by a same distance, as shown in FIGS. 9A and 9B. Additional, portions of the first mask structure 220 in the second region 212 are impervious to the etching.

Figure 10A:
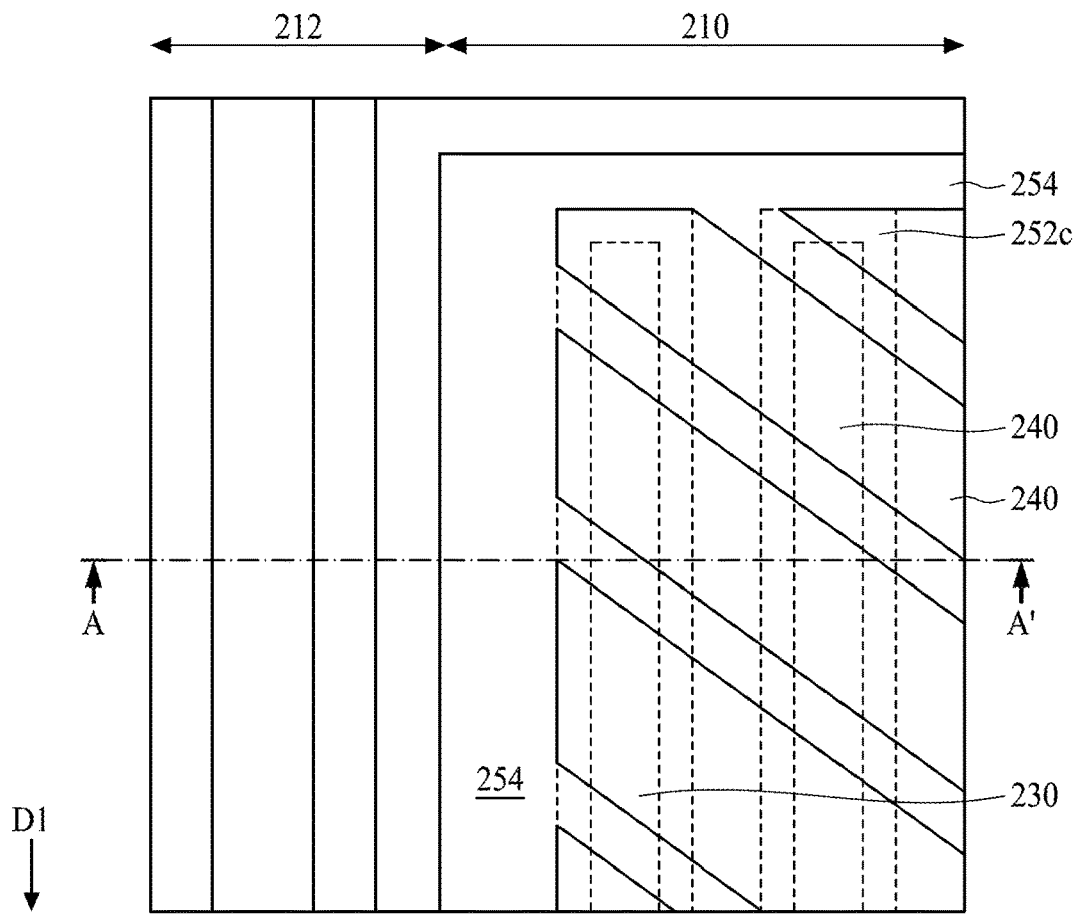
Figure 10B:
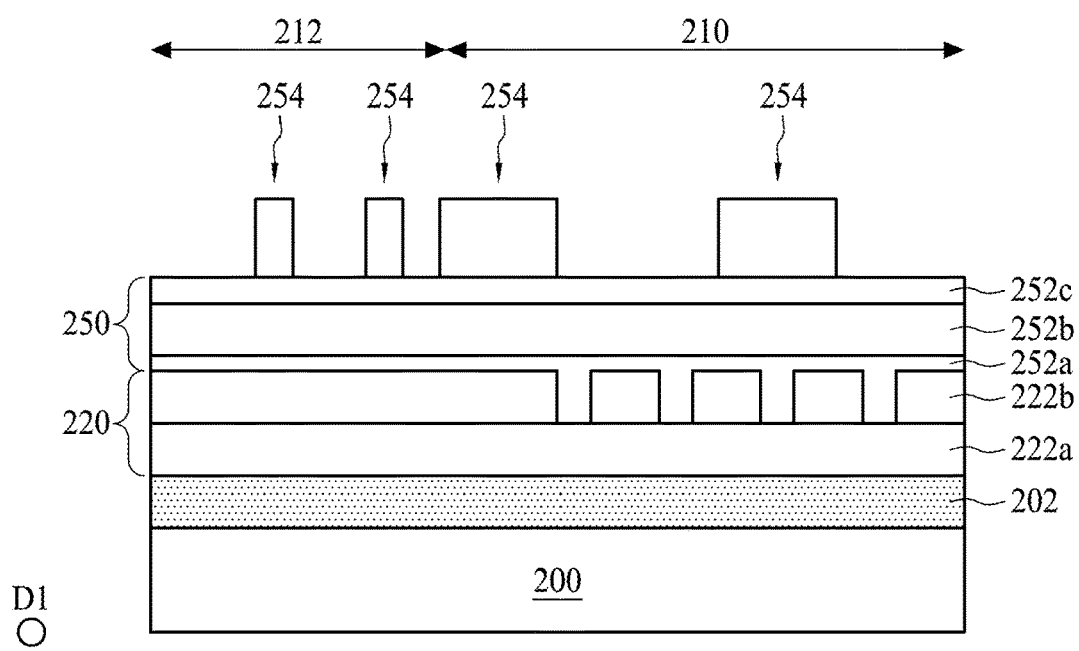

Referring to FIGS. 10A and 10B, a second mask structure 250 is formed over the first mask structure 220 according to step 130. In some embodiments, the second mask structure 250 can include a lower mask layer 252a, a middle mask layer 252b and an upper mask layer 252c sequentially stacked on the first mask structure 220. In some embodiments, the lower mask layer 252a can be formed to fill spaces between first patterns 240. Consequently, an even surface is obtained due to the lower mask layer 252a. Next, the middle mask layer 252b and the upper mask layer 252c are sequentially formed on the lower mask layer 252a. The lower mask layer 252a, the middle mas layer 252b and the upper mask layer 252c can include different materials or materials sufficiently different in compositions from each other. One of ordinary skill in the art would easily understand that the present disclosure may include selecting a single hard mask or a bi-layered hard mask based on cost, time, performance, and processing considerations for a given application.

Still referring to FIGS. 10A and 10B, a patterned photoresist 254 is formed over the second mask layer 250. The patterned photoresist 254 can include lines formed by performing, for example but not limited to, conventional photolithography, as is known in the art of semiconductor manufacturing. It should be understood that although several lines of the patterned photoresist 254 are illustrated in FIGS. 10A and 10B for simplicity of explanation, any number of lines may be formed, as will be apparent to one of ordinary skill in the art upon consideration of the present disclosure.

Figure 11A:
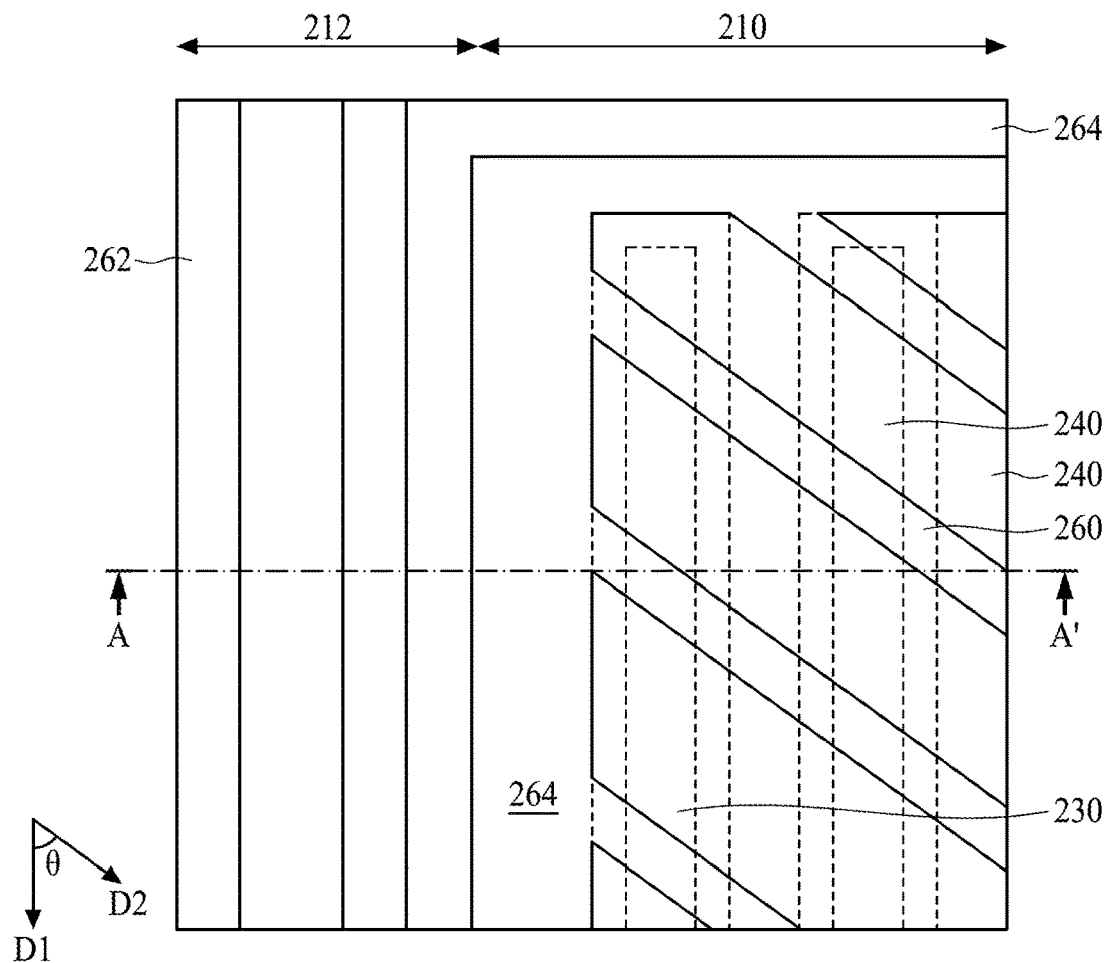
Figure 11B:
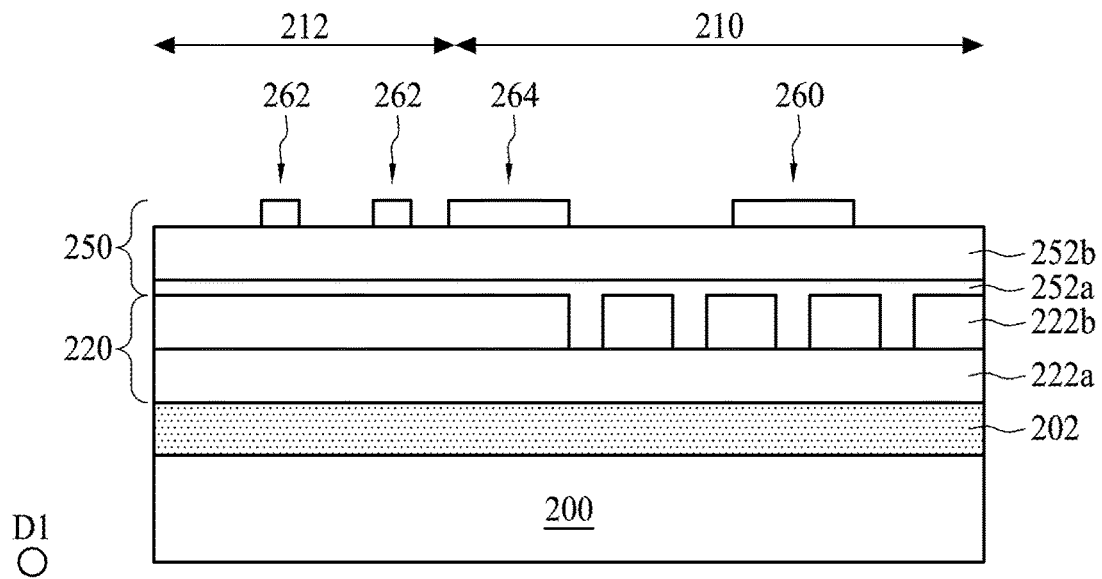

Referring to FIGS. 11A and 11B, portions of the second mask layer 250, such as portions of the upper mask layer 252c, are then etched through the patterned photoresist 254. Accordingly, a plurality of third patterns 260 are formed in the first region 210 and a plurality of fourth patterns 262 are formed in the second region 212 over the second mask structure 250 according to step 141. In some embodiments, the third patterns 260 extend in a second direction D2 while the fourth patterns 262 extend in the first direction D1. As shown in FIG. 11A, the second direction D2 is different from the first direction D1. In some embodiments, the first direction D1 and the second direction D2 form an included angle θ, and the included angle θ is equal to or less than 90°, but the disclosure is not limited thereto. Further, as shown in FIGS. 11A and 11B, distances between adjacent pairs of fourth patterns 262 are the same, and distances between adjacent pairs of third patterns 260 are the same. In some embodiments, a frame pattern 264 can be formed between the first region 210 and the second region 212. In further detail, the frame pattern 264 is disposed between the third pattern 260 and the fourth pattern 262. In some embodiments, the frame pattern 264 surrounds the third patterns 260, and the third patterns 260 are all physically in contact with the frame pattern 264, but the disclosure is not limited thereto. Further, the frame pattern 264 is separated from the fourth pattern 262. In some embodiments, a portion of the frame pattern 264 extends in the first direction D1, as shown in FIG. 11A, and a distance between the portion of the frame pattern 264 and its adjacent fourth pattern 262 is less than the distance between any two adjacent fourth patterns 262. In some embodiments, the distance between the portion of the frame pattern 264 and its adjacent fourth pattern 262 can be equal to a predetermined value, such as a minimum spacing width of the design rule for forming the third patterns 260, the fourth patterns 262 and the frame patterns 264. In some embodiments, a width of the third patterns 260 is substantially equal to a width of the fourth patterns 262. In some embodiments, a width of the frame pattern 264 is greater than the width of the third patterns 260 and the width of the fourth patterns 262, but the disclosure is not limited thereto.

Figure 12A:
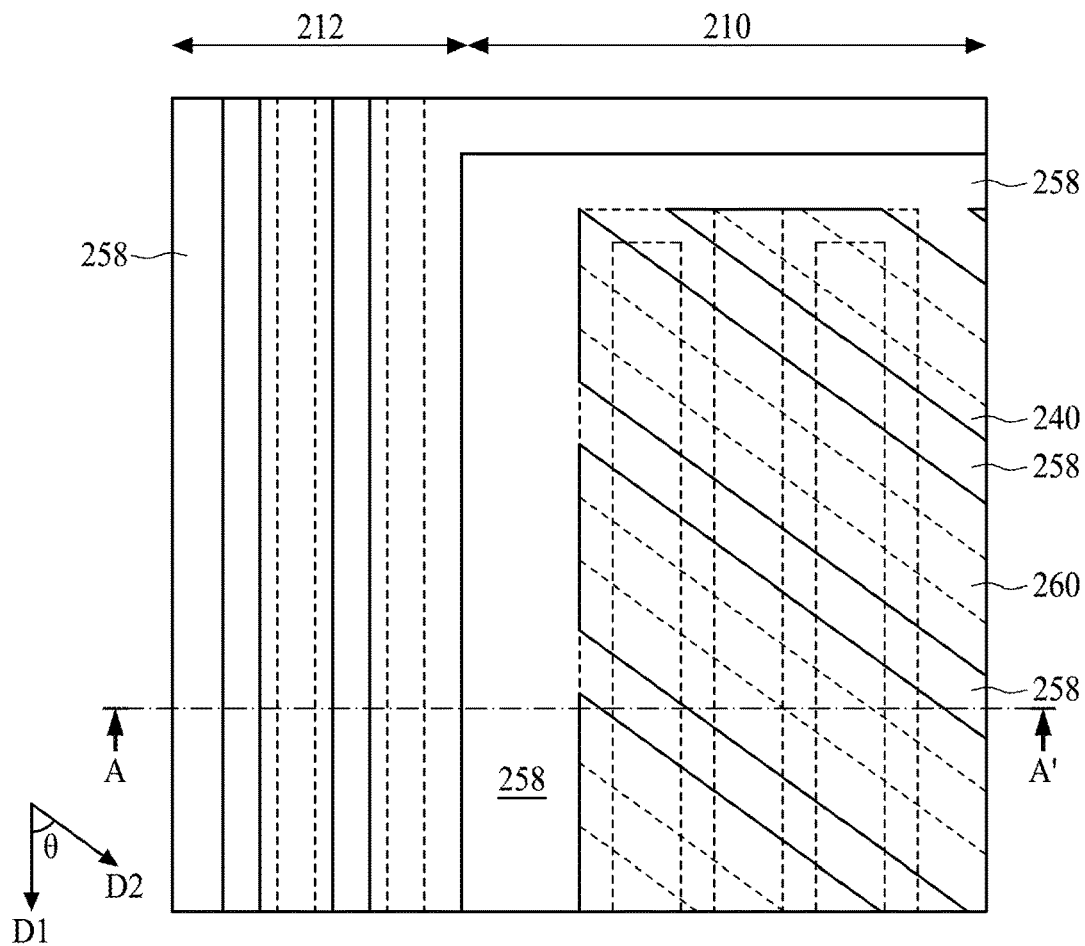
Figure 12B:
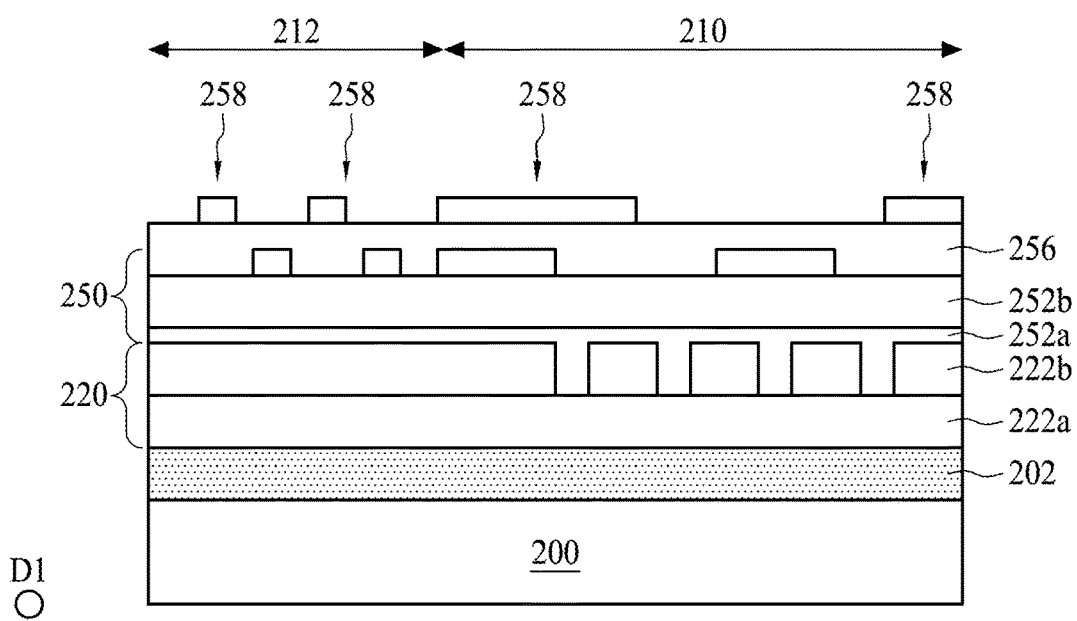

Referring to FIGS. 12A and 12B, another sacrificial layer 256 or another mask layer 256 is formed to fill spaces between the third patterns 260, the fourth patterns 262, and the frame pattern 264 and to provide a substantially even surface as shown in FIG. 12B. Another patterned photoresist 258 is formed over the sacrificial layer 256. The patterned photoresist 258 can include lines formed by performing, for example but not limited to, conventional photolithography, as is known in the art of semiconductor manufacturing. It should be understood that although several lines of the patterned photoresist 258 are illustrated in FIGS. 12A and 12B for simplicity of explanation, any number of lines may be formed, as will be apparent to one of ordinary skill in the art upon consideration of the present disclosure.

Figure 13A:
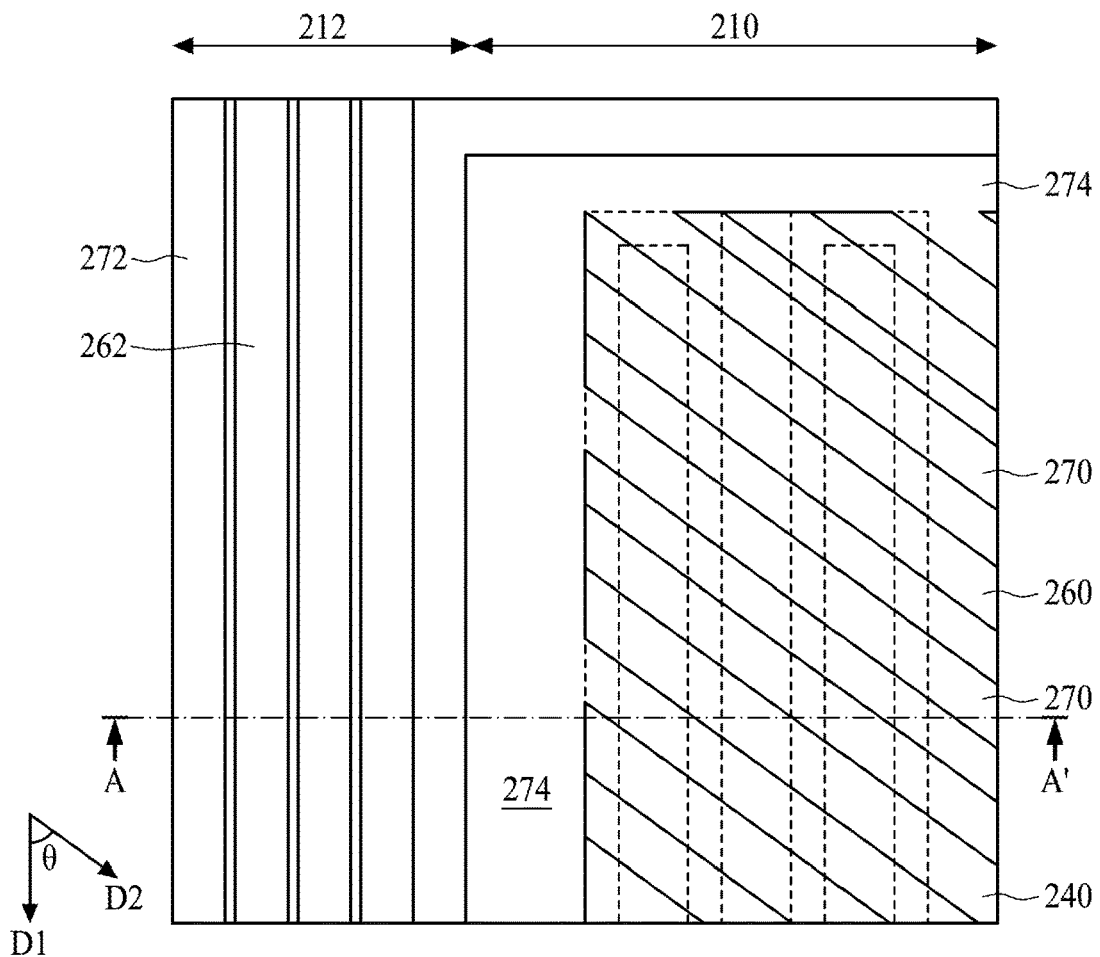
Figure 13B:
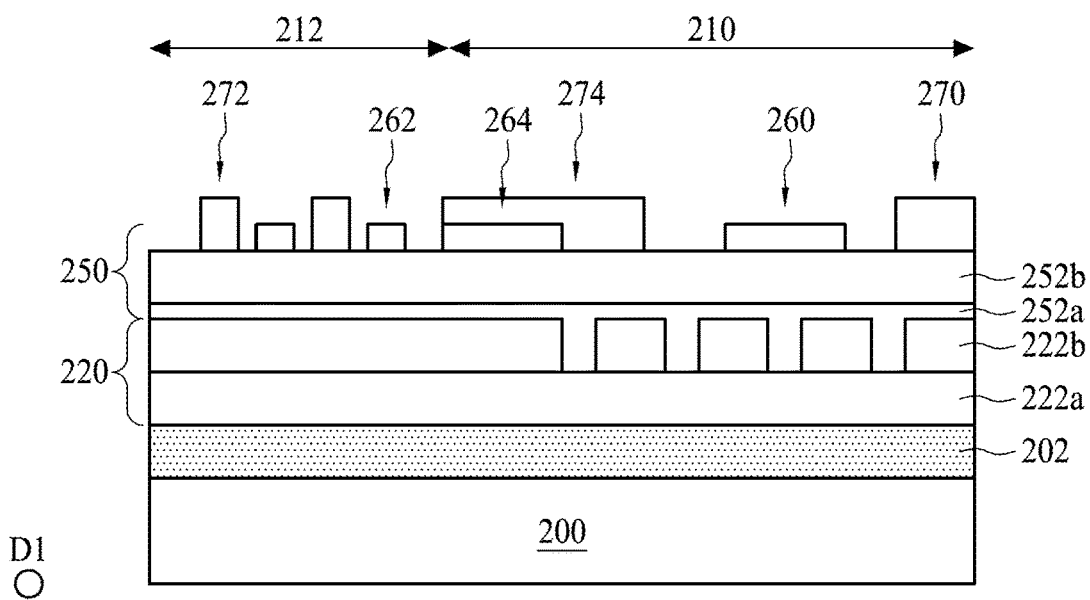

Referring to FIGS. 13A and 13B, a portion of the sacrificial layer 256 is then etched through the patterned photoresist 258. Accordingly, a plurality of fifth patterns 270 is formed in the first region 210 and a plurality of sixth patterns 272 is formed in the second region 212 over the second mask structure 250 according to step 142. In some embodiments, the fifth patterns 270 extend in the second direction D2 while the sixth patterns 272 extend in the first direction D1. Further, the third patterns 260 and the fifth patterns 270 are alternately arranged, and the fourth patterns 262 and the sixth patterns 262 are alternately arranged, as shown in FIGS. 13A and 13B. Distances between adjacent pairs of fifth patterns 270 are the same, and distances between adjacent pairs of sixth patterns 272 are the same. Further, distances between adjacent third and fifth patterns 260 and 270 are the same, and distances between the adjacent fourth and sixth patterns 262 and 272 are the same. In some embodiments, a frame pattern 274 can be formed between the first region 210 and the second region 212. The frame patterns 274 can cover the frame pattern 264, but the disclosure is not limited thereto. In some embodiments, the frame pattern 274 surrounds the fifth patterns 270, and the fifth patterns 270 are all physically in contact with the frame pattern 274, but the disclosure is not limited thereto. Further, the frame pattern 274 is separated from the sixth patterns 272. In some embodiments, a width of the fifth patterns 270 is substantially equal to a width of the sixth patterns 272. In some embodiments, a width of the frame pattern 274 is greater than the width of the fifth patterns 270 and the width of the sixth patterns 272, but the disclosure is not limited thereto. In some embodiments, the width of the third patterns 260, the width of the fourth patterns 262, the width of the fifth patterns 270 and the width of the sixth patterns 272 are all the same, but the disclosure is not limited thereto.

Figure 14A:
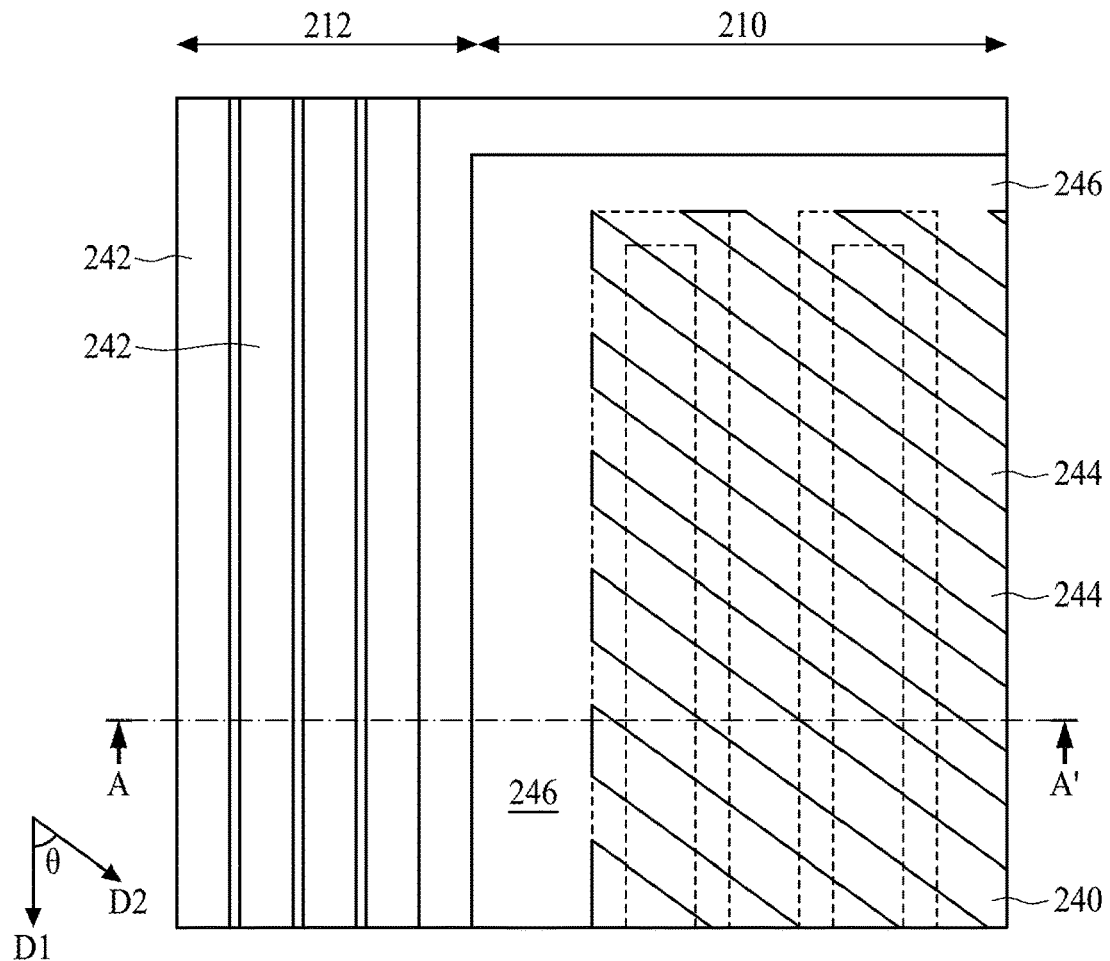
Figure 14B:
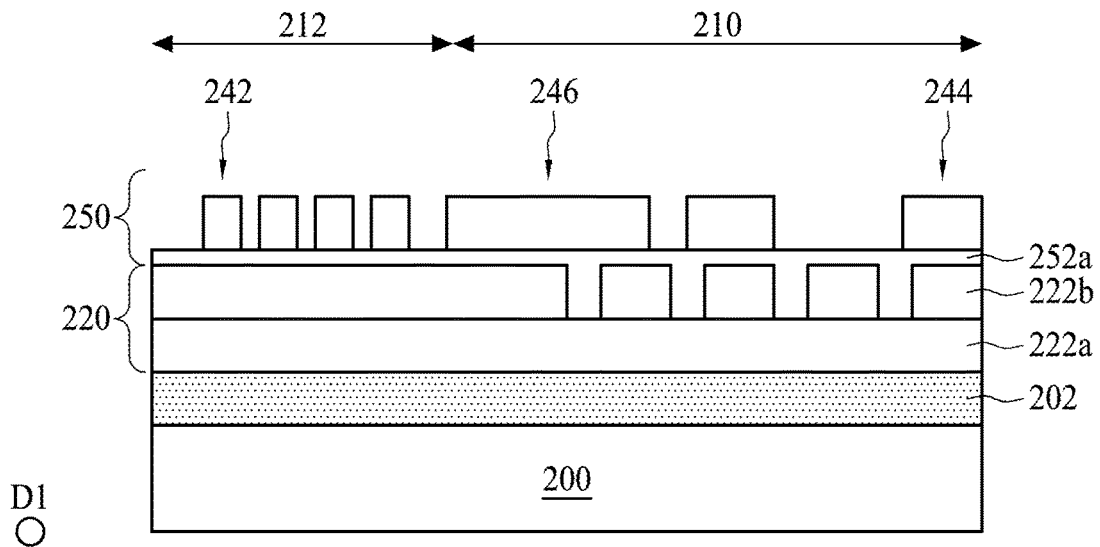

Referring to FIGS. 14A and 14B, the third patterns 260, the fourth patterns 262, the fifth patterns 270, the sixth patterns 272, and the frame patterns 264 and 274 are all transferred to the second mask structure 250 according to step 143. Accordingly, a plurality of second features 242 is formed in the second region 212, and a plurality of third features 244 is formed in the first region 210 in the second mask structure 250, simultaneously, according to step 140, which includes the above mentioned steps 141 to 143. The second features 242 extend in the first direction D1 and the third features 244 extend in the second direction D2. Further, a frame feature 246 is formed between the first region 210 and the second region 212. As shown in FIGS. 14A and 14B, the third features 244 are in contact with the frame feature 246. At least a portion of the frame feature 246 is adjacent to one of the second features 242.

Figure 15A:
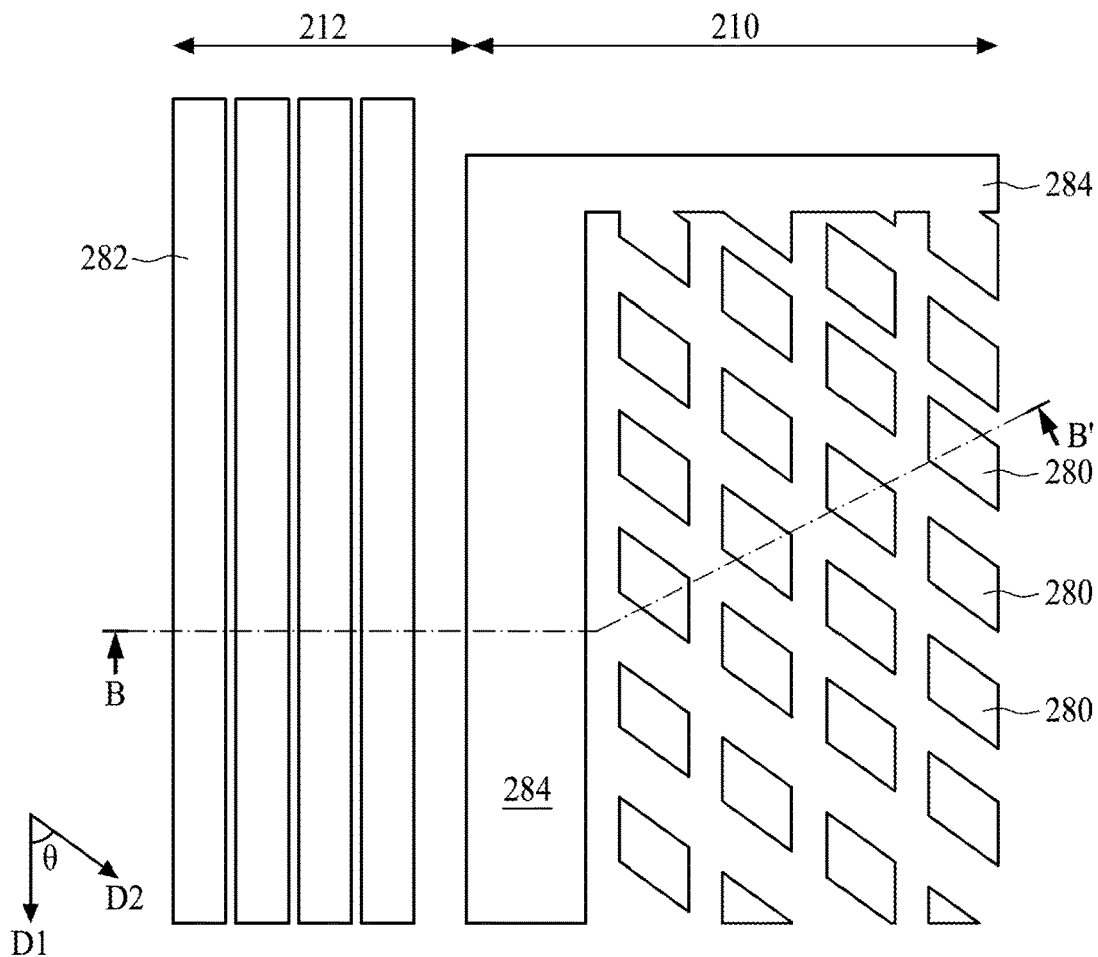
Figure 15B:
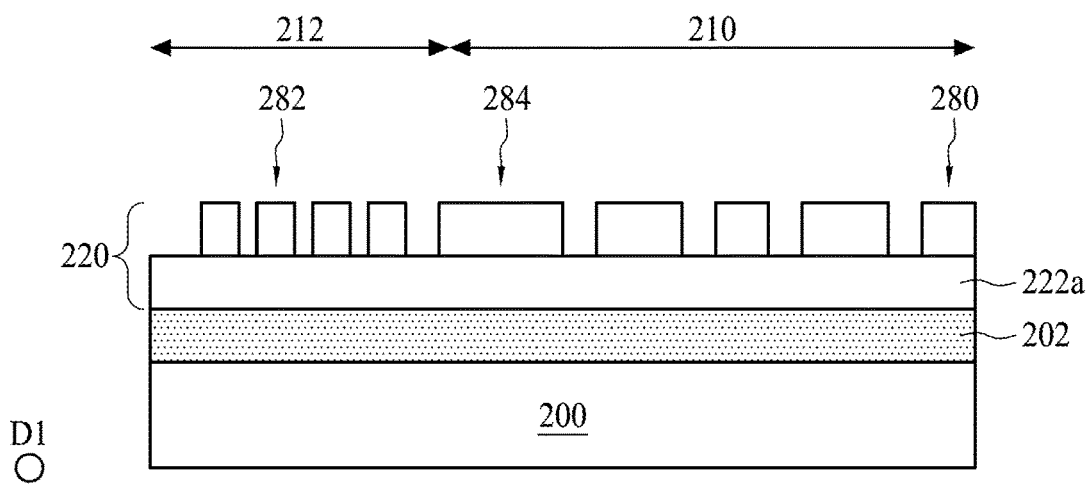

Referring to FIGS. 15A and 15B, in some embodiments, the second features 242, the third features 244 and the frame features 246 are transferred to the first mask structure 220. Consequently, the line-shaped first features 240 are cut during transferring of the third features 244. Therefore, a plurality of islanding features 280 is formed in the first region 212 and a plurality of line features 282 is simultaneously formed in the second region 212 in the first mask structure 220 according to step 150. Additionally, the frame feature 246 is transferred from the second mask structure 250 to the first structure 220 to form the frame feature 284.

Figure 16A:
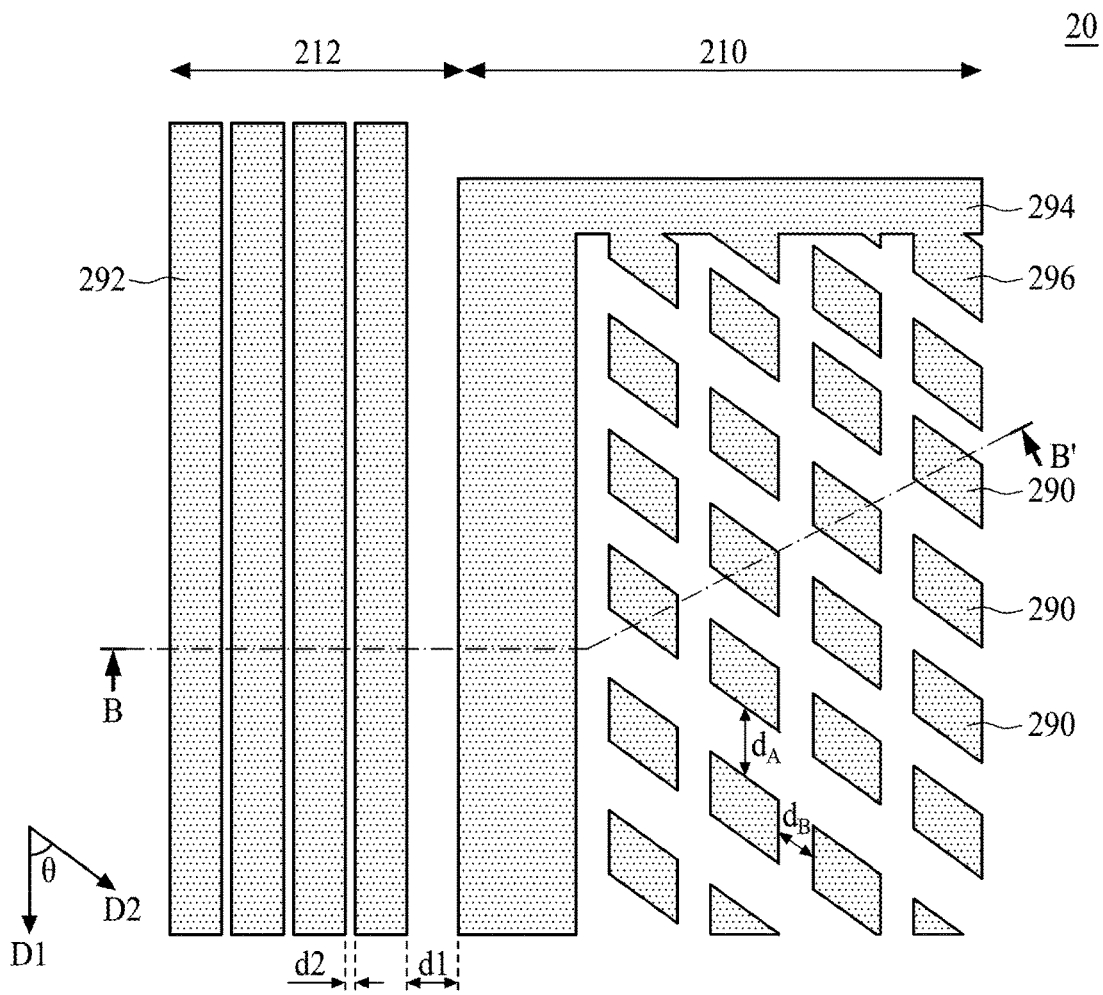
Figure 16B:
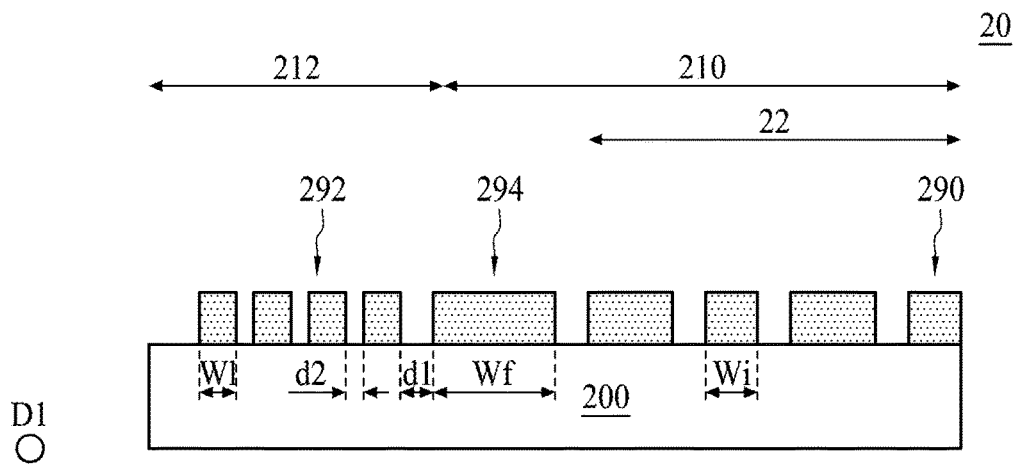

Referring to FIGS. 16A and 16B, the islanding features 280, the line features 282 and the frame features 284 can be transferred from the first mask structure 220 to the substrate 200 or the target layer 202 to form a plurality of islanding structures 290, in the first region 210, a plurality of line structures 292 in the second region 212, and a frame structure 294 between the first region 210 and the second region 212, according to step 160.

Please still refer to FIGS. 16A and 16B. According to some embodiments of the present disclosure, a semiconductor structure 20 is provided. The semiconductor structure 20 includes the substrate 200/202 including the first region 210 and the second region 212 defined thereon, the plurality of islanding structures 290 disposed in the first region 210, the plurality of line structures 292 disposed in the second region 212, and the frame structure 294 disposed between the first region 210 and the second region 212. The islanding structures 290, the line structures 292 and the frame structure 294 all include a same material. As shown in FIGS. 16A and 16B, the islanding structures 290 are arranged in the first direction D1 and the second direction D2 to form an array 22. As mentioned above, the first direction D1 and the second direction D2 are different from each other, and the included angle θ formed by the first direction D1 and the second direction D2 can be equal to or less than 90°. The line structures 292 extend in the first direction D1. The frame structure 294 is adjacent to one of the line structures 292. A distance d1 between the frame structure 294 and its adjacent line structure 292 is greater than a distance d2 between two adjacent line structures 292 as shown in FIGS. 16A and 16B.

In some embodiments of the present disclosure, distances $d_A$ between adjacent pairs of islanding structures 290 in the first direction D1 are the same, and distances $d_B$ between adjacent pairs of islanding structures 290 in the second direction D2 are the same. As shown in FIGS. 16A and 16B, the frame structure 294 surrounds the array 22 formed by the islanding structures 290. In some embodiments, a width Wf of the frame structure 294 is greater than a width Wl of the line structures 292, but the disclosure is not limited thereto. In some embodiments, the width Wf of the frame structure 294 is greater than a width Wi of the islanding structures 290, but the disclosure is not limited thereto. In some embodiments of the present disclosure, the semiconductor structure 20 further includes at least a dummy structure 296 disposed between one of the islanding structures 290 and the frame structure 294. Further, the dummy structure 296 is in contact with the frame structure 294, as shown in FIG. 16A.

In the present disclosure, a method for forming a semiconductor structure 10 is provided. The method 10 includes forming the first features 240 in the first region 210 by a pitch doubling process, and forming the second features 242 in the second region 212 and the third features 244 in the first region 210 by double patterning. By integrating the two processes sophisticated and fine islanding features 280 can be formed in the first region 210 while the slim line features 282 are formed in the second region 212, simultaneously. Accordingly, process duration is reduced.

In contrast, with a comparative method, the islanding structures in the first region are formed before or after the formation of the line structures in the second region, and thus the comparative methods suffer from certain disadvantages, such as long process duration and limited process throughput.

One aspect of the present disclosure provides a method for preparing a semiconductor structure. The method includes the following steps: A substrate including a first region and a second region defined thereon is provided. A first mask structure is formed over the substrate. A plurality of first features extending in a first direction is formed in the first mask structure in the first region. A second mask structure is formed over the first mask structure. A plurality of second features is formed in the second mask structure in the second region and a plurality of third features is formed in the second mask structure in the first region, simultaneously. The second features extend in the first direction and the third features extend in a second direction different from the first direction. The second features and the third features are transferred to the first mask structure to simultaneously form a plurality of islanding features in the first region and a plurality of line features in the second region.

Another aspect of the present disclosure provides a semiconductor structure. The semiconductor structure includes a substrate including a first region and a second region defined thereon, a plurality of islanding structures disposed in the first region, a plurality of line structures disposed in the second region, and a frame structure disposed between the first region and the second region. The islanding structures are arranged in a first direction and a second direction to form an array. The first direction and the second direction are different from each other. The line structures extend in the first direction. The frame structure is adjacent to one of the line structures, and a distance between the frame structure and its adjacent line structure is greater than a distance between two adjacent line structures.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for preparing a semiconductor structure, comprising:
    providing a substrate comprising a first region and a second region defined thereon;
    forming a first mask structure over the substrate;
    forming a plurality of first features extending in a first direction in the first mask structure in the first region;
    forming a second mask structure over the first mask structure;
    simultaneously forming a plurality of second features in the second region and a plurality of third features in the first region in the second mask structure, the second features extending in the first direction and the third features extending in a second direction different from the first direction; and
    transferring the second features and the third features to the first mask structure to simultaneously form a plurality of islanding features in the first region and a plurality of line features in the second region.

2. The method of claim 1, wherein the forming the first features further comprises:
    forming a plurality of first patterns over the first mask structure;
    forming a plurality of spacers over sidewalls of each first pattern;
    forming a plurality of second patterns over the first mask structure;
    removing the spacers to form a plurality of openings between the first patterns and the second patterns; and
    etching the first mask structure through the openings to form the first features.

3. The method of claim 1, wherein the second mask structure fills spaces between the first features to form an even surface.

4. The method of claim 1, wherein the forming the second features and the third features further comprises:
    forming a plurality of third patterns in the first region and a plurality of fourth patterns in the second region over the second mask structure;
    forming a plurality of fifth patterns in the first region and a plurality of sixth patterns in the second region over the second mask structure, wherein the third patterns and the fifth patterns are alternately arranged, and the fourth patterns and the sixth patterns are alternately arranged; and
    transferring the third patterns, the fourth patterns, the fifth patterns, and the sixth patterns to the second mask structure to form the second features and the third features.

5. The method of claim 4, wherein the third patterns and the fifth patterns extend in the second direction, and the fourth patterns and the sixth patterns extend in the first direction.

6. The method of claim 4, wherein distances between adjacent third and fifth patterns are the same.

7. The method of claim 4, wherein distances between adjacent fourth and sixth patterns are the same.

8. The method of claim 1, further comprising forming a frame feature between the first region and the second region.

9. The method of claim 8, wherein the third features are in contact with the frame features.

10. The method of claim 8, wherein at least a portion of the frame feature is adjacent to one of the second features.

11. The method of claim 1, further comprising transferring the islanding features and the line features from the first mask structure to the substrate to form a plurality of islanding structures in the first region and a plurality of line structures in the second region.

12. The method of claim 1, wherein the first direction and the second direction comprise an included angle, and the included angle is equal to or less than 90°.

* * * * *